(12) United States Patent
Nishikawa et al.

(10) Patent No.: US 6,590,337 B1
(45) Date of Patent: Jul. 8, 2003

(54) SEALING STRUCTURE FOR DISPLAY DEVICE

(75) Inventors: Ryuji Nishikawa, Gifu (JP); Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 31 days.

(21) Appl. No.: 09/670,679

(22) Filed: Sep. 27, 2000

(30) Foreign Application Priority Data

Sep. 29, 1999 (JP) .......................................... 11-277088

(51) Int. Cl.[7] .............................................. H05B 33/26
(52) U.S. Cl. ...................... 313/509; 313/512; 428/917; 315/169.3; 345/76
(58) Field of Search ................................ 313/509, 512, 313/500, 505; 428/917, 690; 345/36, 45, 55, 76; 315/169.3

(56) References Cited

U.S. PATENT DOCUMENTS 5,463,279 A * 10/1995 Khormaei ................ 315/169.3
5,757,126 A * 5/1998 Harvey, III et al. ......... 313/506
5,920,080 A * 7/1999 Jones .......................... 257/40
6,346,772 B1 * 2/2002 Nishiki et al. .............. 313/587
6,403,237 B1 * 6/2002 Noguchi et al. ............ 428/690

FOREIGN PATENT DOCUMENTS

JP         09148066 A      6/1997

* cited by examiner

Primary Examiner—Ashok Patel
(74) Attorney, Agent, or Firm—Cantor Colburn LLP (57) ABSTRACT

In a display device formed by adhering substrates facing one another using a seal, a buffer layer is disposed between the seal and a substrate to prevent separation between the substrates. Specifically, for example, a display region is configured by covering switching elements with a planarizing insulating film for planarization, then forming, in order, pixel electrodes, an emissive layer, and a counter electrode. The planarizing insulating film is extended beyond the display region to an area under the seal. The planarizing insulating film functions as the buffer layer to absorb the stress generated during curing of the seal, thereby preventing separation between the substrate and the protective casing.

65 Claims, 3 Drawing Sheets

SEALING STRUCTURE FOR DISPLAY DEVICE

BACKGROUND OF THE INVENTION

1. Field of the Invention

The present invention relates to a display device comprising a light-emitting layer such as an electroluminescence (hereinafter referred to as "EL") element disposed on a substrate, and particularly to a sealing structure for an organic EL display device.

2. Description of the Prior Art

Figure 1A:
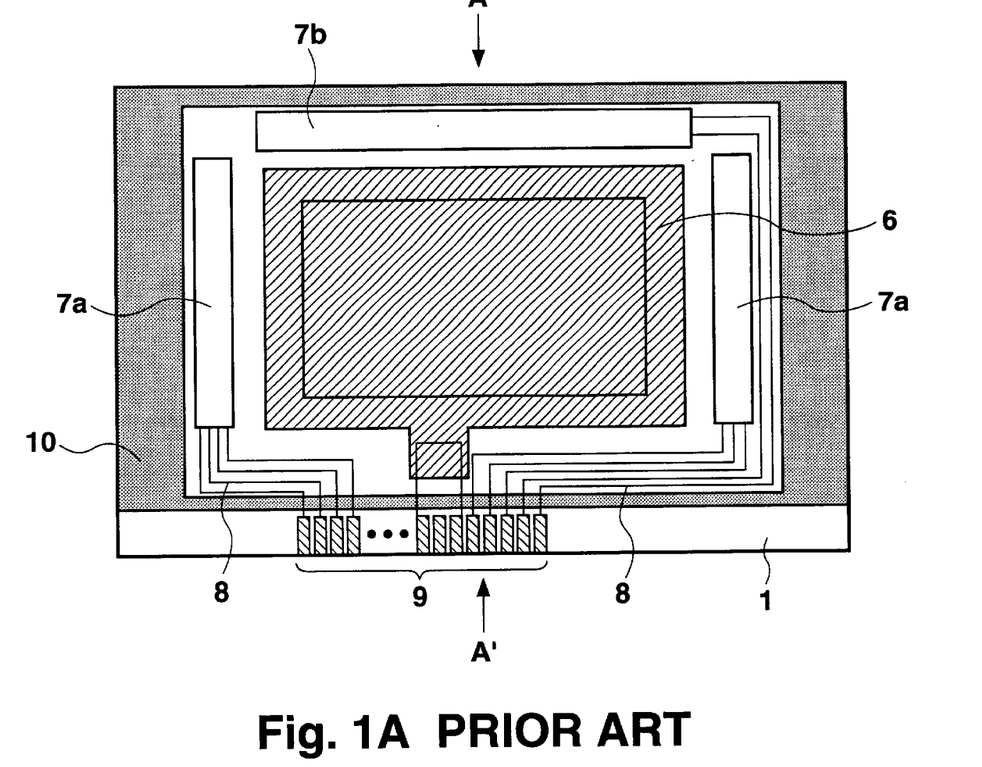
FIGS. 1A and 1B show a plan view and a cross-sectional view of a conventional display device.
Figure 1B:
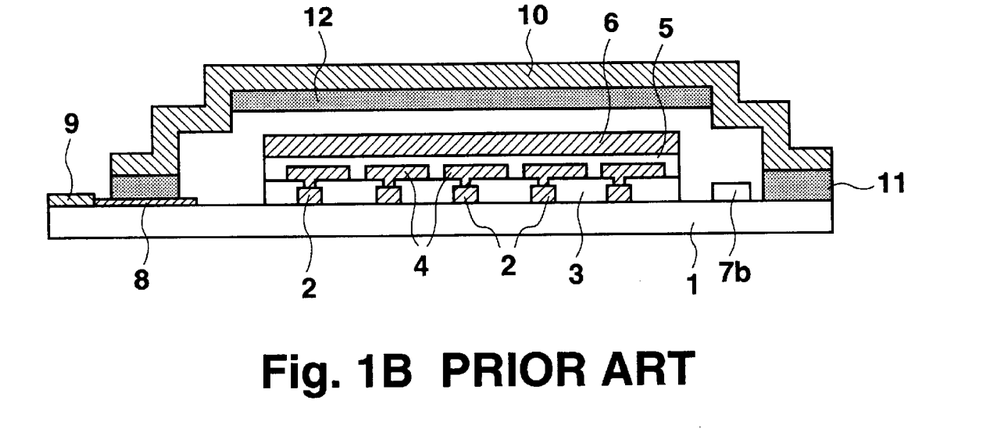

In the recent years, organic EL display devices have gained attention as devices that may replace CRTs and LCDs. FIG. 1A is a plan view of a conventional organic EL display device, and FIG. 1B shows a cross-sectional view taken along line A–A' of FIG. 1A. A plurality of selective drive circuits 2 are disposed for respective pixels on a transparent substrate 1. A planarizing insulating film 3 is formed covering the selective drive circuits 2. A contact hole is created in the planarizing insulating film 3 in a position corresponding to each selective drive circuit 2. Each selective drive circuit 2 is connected to a pixel electrode 4 through this contact hole. An emissive layer 5 and a counter electrode 6 are disposed covering those structures. Surrounding the pixel region including the selective drive circuits 2, pixel electrodes 4, emissive layer 5, and counter electrode 6, display driver circuits 7a, 7b are arranged for controlling the selective drive circuits 2 and applying predetermined voltages to the pixel electrodes 4 so as to drive the display region. The driver circuits 7 are connected to terminals 9 by wiring 8. A protective casing 10 composed of a metal such as aluminum is arranged covering these structures, and adhered to the transparent substrate 1 using an adhesive 11 made of a resin cured by ultraviolet rays. The sealed space between the protective casing 10 and the transparent substrate 1 is filled with dry nitrogen. A desiccant sheet 12 is disposed on the inner surface of the protective casing 10.

A selective drive circuit 2 comprises, for example, a plurality of semiconductor elements including thin film transistors (TFT). A first TFT switches between "on" (conductive state) and "off" (non-conductive state) in response to the output from the driver circuit 7a. When the first TFT of a selective drive circuit 2 is turned on by an output from the driver circuit 7a, the corresponding pixel electrode 4 is applied with a voltage according to an output from the driver circuit 7b via a second TFT. An electric current thereby flows between the pixel electrode 4 and the counter electrode 6. The emissive layer 5 is configured to emit light when a current is made to flow therein by the pixel electrode 4 and the counter electrode 6, and emits light at an intensity according to the amount of current flowing between the pixel electrode 4 and the counter electrode 6. The generated light transmits downward in the cross-sectional view through the transparent substrate 1 to be observed.

In the organic EL element, holes injected from the anode and electrons injected from the cathode recombine within the emissive layer. As a result, organic molecules constituting the emissive layer are excited, generating excitons. Through the process in which these excitons undergo radiation until deactivation, light is emitted from emissive layer. This light radiates outward through the side of the transparent anode via the transparent insulator substrate, resulting in light emission.

An organic EL layer 5 is known to be susceptible to degradation by moisture. When, for example, a defect such as a pinhole is present in the counter electrode 6, moisture entering from the pinhole may cause oxidation of the counter electrode 6 or separation between the organic EL layer 5 and the counter electrode 6, producing dark spots and resulting in deterioration of display quality. It is the function of the protective casing 10 not only to protect the display region and the driver circuits 7 from physical shock, but also to prevent moisture from entering the device. The protective casing 10 is therefore formed in a shape of a tray covering the display region. Further, to prevent damage by penetrating moisture, the space inside the protective casing 10 is filled with an inert gas such as dry nitrogen or helium, and the desiccant sheet 12 is disposed. A stepped portion may be provided in the location for arranging the desiccant sheet 12. The structure as described above is disclosed, for example, in Japanese Patent Laid-Open Publication No. Hei 9-148066.

However, in a conventional sealing structure, the protective casing 10 is adhered to the transparent substrate 1 by directly applying the adhesive 11 on the transparent substrate 1. By such a method, the adhesive may peel off during curing of the adhesive 11 due to the difference in the coefficient of thermal expansion between the transparent substrate 1 and the protective casing 10, resulting in incomplete sealing.

Moreover, the adhesive 11 is applied over the wiring 8 in areas provided with the wiring 8. A disconnection may be caused in the wiring due to stress generated during curing of the adhesive 11.

SUMMARY OF THE INVENTION

The object of the present invention is to provide an EL display device having a structure preventing separation between the transparent substrate 1 and the protective casing 10 even when there exists a difference in the coefficient of thermal expansion between the transparent substrate 1 and the protective casing 10, while also preventing disconnection in the wiring 8.

The present invention for achieving the above object provides a display device having a display region arranged between first and second substrates composed of different materials, comprising a seal for adhering the first and second substrates to one another, and a buffer layer between the seal and the first and/or second substrate.

The buffer layer may be an insulating film.

In another aspect of the present invention, the display region is configured by laminating a plurality of thin films including an insulating film. The insulating film extends to an area between the seal and the first and/or second substrate to serve as the buffer layer.

In a further aspect, the display region comprises selective drive circuits provided for each pixel, a planarizing insulating film formed covering the selective drive circuits, and pixel electrodes disposed on the planarizing insulating film corresponding to each of the selective drive circuits. The planarizing insulating film serves as the buffer layer.

The first substrate may be a transparent insulating substrate, and the second substrate may be a protective casing formed covering the display region.

Further, the first substrate may be made of glass or resin, and the second substrate may be made of metal.

In another aspect of the present invention, the planarizing insulating film extends in an area between the first substrate and the seal.

The planarizing insulating film may be composed of a material softer compared to the seal and the first substrate.

In a further aspect of the present invention, the display device includes a terminal connected to the display region via a wiring and exposed outside the display device. The buffer layer is arranged between the wiring or the terminal and the seal.

Another aspect of the present invention is a light-emitting device in which an emissive region having an emissive element is sealed between first and second substrates having different coefficients of thermal expansion, wherein the first and second substrates are adhered to one another by a seal in an area surrounding the emissive region, and a buffer layer is formed between the seal and the first and/or second substrate.

A further aspect of the above-described device of the present invention is that a desiccant is mixed in the seal.

According to the present invention, the element provided in the display region or the emissive region may be an organic electroluminescence element containing an organic emissive material.

In a further aspect of the present invention, the emissive region comprises selective drive circuits provided for each pixel, a planarizing insulating film formed covering the selective drive circuits, and pixel electrodes disposed on the planarizing insulating film corresponding to each of the selective drive circuits. The planarizing insulating film serves as the buffer layer.

By providing a buffer layer as described above, stress generated at the seal portion due to causes such as the difference in the coefficient of thermal expansion between the first and second substrates can be absorbed by the buffer layer in the present invention. Accordingly, defects in adhesion between the first and second substrates due to peeling of the seal or other reasons can reliably be prevented.

According to the present invention, the display region is configured by laminating a plurality of thin films including an insulating film, and the insulating film serves as the buffer layer. It is therefore unnecessary to separately provide a buffer layer. The buffer layer can be formed at the same time of forming the display region, simplifying the manufacturing process.

In the present invention, the planarizing insulating film serves as the buffer layer. A planarizing insulating film has a greater thickness compared to a gate insulating film or an interlayer insulating film, and is softer than glass or the seal. Among the insulating films formed within the display region, the planarizing insulating film is most suitable as the buffer layer.

Further, according to the present invention, the display device includes a terminal connected to the display region via a wiring and exposed outside the display device, and a buffer layer is arranged between the wiring or the terminal and the seal. Such an arrangement prevents disconnection of the wiring caused by the stress generated during curing of the seal.

DESCRIPTION OF PREFERRED EMBODIMENT

Figure 2A:
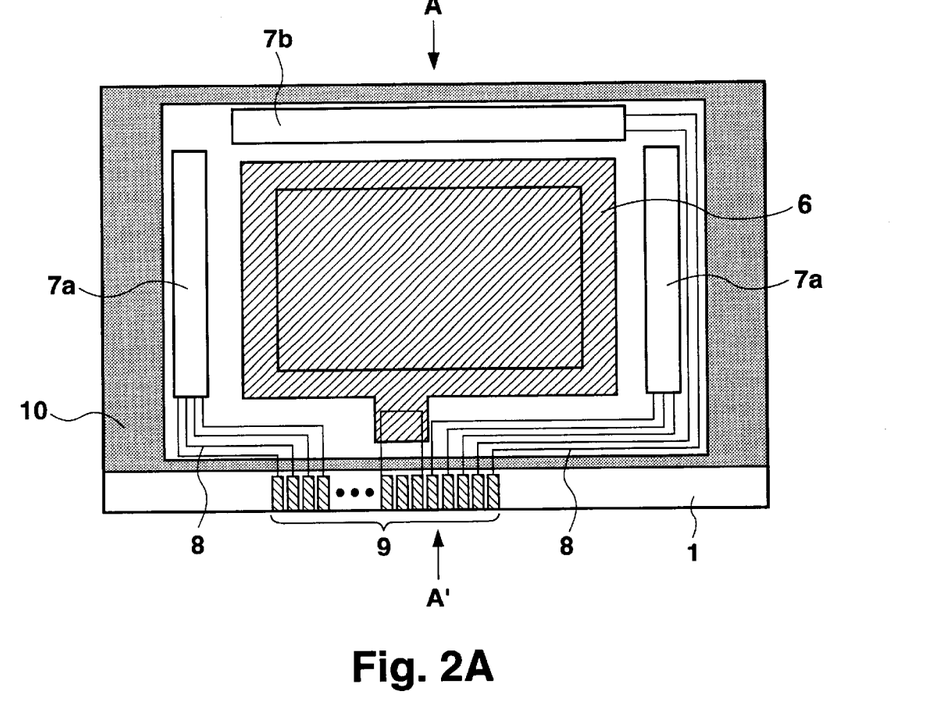
FIGS. 2A, 2B, and 2C show a plan view and cross-sectional views of a display device according to the present invention.
Figure 2B:
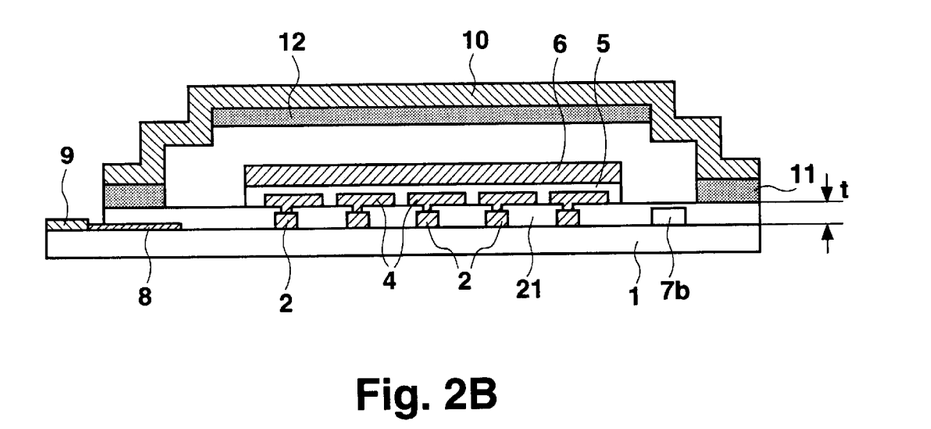

FIG. 2A is a plan view of an organic EL display device according to a preferred embodiment of the present invention, and FIG. 2B shows a cross-sectional view taken along line A–A' of FIG. 2A. Structures similar to those in the conventional device described earlier are labeled with the same reference numerals, and detailed explanation of those structures will not be repeated. Arranged on a transparent substrate for respective pixels are selective drive circuits 2 and pixel electrodes 4. An emissive layer 5 and a counter electrode 6 are disposed covering those structures. Surrounding the pixel region including the selective drive circuits 2, pixel electrodes 4, emissive layer 5, and counter electrode 6, driver circuits 7a, 7b are arranged for controlling the selective drive circuits 2 and applying predetermined voltages to the pixel electrodes 4. The driver circuits 7 are connected to terminals 9 by wiring 8. A protective casing 10 is arranged covering the display region. In the present specification, term "substrate" is used also to refer to the protective casing 10.

A feature of the present embodiment is that a buffer layer is provided between the seal and a substrate. Specifically, in this embodiment, the planarizing insulating film 21 formed covering the selective drive circuits 2 is extended beyond the display region and arranged between the seal 11 and the substrate 1.

The planarizing insulating film 21 is positioned between the seal 11 and the substrate 1. The planarizing insulating film 21 is softer compared to the seal 11 and the substrate 1. Even when stress is imposed on the seal 11 during curing of the seal 11 due to the difference in the coefficient of thermal expansion between the substrate 1 and the protective casing 10, the planarizing insulating film 21 functions as the buffer layer and absorbs the stress, preventing separation between the substrate 1 and the protective casing 10.

The significant feature of the present invention is that a buffer layer softer than the seal 11 is disposed between the seal 11 and the substrate 1. The buffer layer is not limited to a planarizing insulating film 21, and may be composed of any material softer than the seal 11. However, in an arrangement wherein the wiring 8 is laid under the seal 11 to connect with the terminals 9 exposed outside, the buffer layer must at least be an insulating film.

Other than by extending a film used in the laminated structure of the display region, the buffer layer can obviously be provided by forming separately. However, as the display region comprises several layers of insulating films, the buffer layer can efficiently be formed without adding a manufacturing process by extending one or more of those several layers to the area of the seal 11.

Figure 2C:
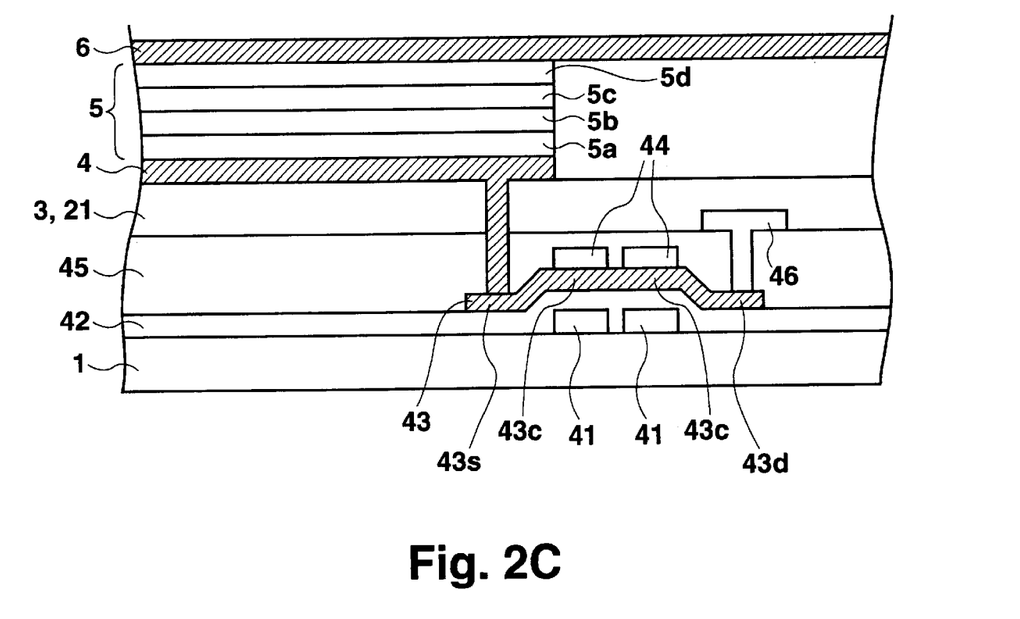

Among the several insulating films formed in the display region, the planarizing insulating film 21 is formed at a greater thickness of 1 $\mu$m–2 $\mu$m compared to the gate insulating film 42 and the interlayer insulating film 45 having a thickness of 500 Å–2000 Å, because the planarizing insulating film 21 has the function to planarize unevenness produced by the structures formed in the underlying layers. The planarizing insulating film 21 is optimal as the buffer layer because of its sufficient thickness.

Materials such as acrylic resin, silicon oxide film, silicon nitride film, and positive type resist material can be used as the material for the planarizing insulating film 21. However, because plural display devices are fabricated simultaneously on one large mother glass in the same process and subsequently divided, acrylic resins and positive type resist materials, which are suitable for processing a large area, are more preferable compared to rotational application type materials used for semiconductor chips, namely, SOG films. Further, for the planarizing insulating film 21, it is preferable to select a material having the minimum possible moisture permeability because the organic EL element having an emissive layer is easily deteriorated by moisture. Display quality becomes degraded when moisture enters the sealed space formed by the substrate 1 and the protective casing 10.

By increasing the thickness of the planarizing insulating film 21, the film 21 demonstrates a superior performance as a buffer layer. However, at the same time, area of the film 21 exposed outside becomes increased, in turn increasing the amount of moisture penetrating from the exposed portions. It is therefore preferable to form the planarizing insulating film 21 at a minimum possible thickness within the range that the film 21 can sufficiently function as the buffer layer.

Using any of the above-mentioned materials of the planarizing insulating film 21, slight permeation of moisture is inevitable. To deal with this problem, desiccant powder can be mixed in the seal 11. The desiccant powder adsorbs the moisture permeating through the planarizing insulating film 21 to accomplish a more reliable prevention of deterioration of the organic EL element. Because the planarizing insulating film 21 is 1 μm–2 μm as described above, moisture permeation through the planarizing insulating film 21 into the sealed space can be prevented by mixing the desiccant in the seal 11, without requiring to mix the desiccant in the planarizing insulating film 21. The desiccant is mixed into the seal 11 before curing. By curing the resin after the mixture is thoroughly mixed, the desiccant can uniformly be mixed in the seal 11. As the desiccant, a substance having a chemically adsorptive property is used. Examples of chemically adsorptive desiccants include oxides of alkali earth metals such as calcium oxide and barium oxide, halides of alkali earth metals such as calcium chloride, and phosphorus pentaoxide. Physically adsorptive desiccants such as silica gel are not appropriate because such desiccants discharge adsorbed moisture at high temperatures.

FIG. 2C is a cross-sectional view of an example configuration showing one pixel of an active matrix type organic EL display device according to the present embodiment. A gate electrode 41 made of a refractory metal such as Cr or Mo is formed on an insulator substrate 1 made of quartz glass, non-alkali glass, or a similar material. Over the gate electrode 41, a gate insulating film 42 composed of $SiO_2$ and an active layer 43 composed of p-Si film are sequentially formed. The active layer 43 includes a channel 43c located above the gate electrode 41. On both sides of the channel 43c, ion doping is performed by using a stopper insulating film 44 located over the channel 43c as a mask. Further ion doping is subsequently performed by covering both sides of the gate electrode 41 with a resist. As a result, low-concentration regions are formed on both sides of the gate electrode 41, and a source 43s and a drain 43d, which are high-concentration regions, are disposed on the outboard sides of the low-concentration regions. The gate electrode 41, the gate insulating film 42, and the active layer 43 are arranged in a configuration of a TFT, and constitute a part of the selective drive circuit. The TFT is formed in the so-called LDD structure.

An interlayer insulating film 45 formed by a sequential lamination of a $SiO_2$ film, a SiN film, and a $SiO_2$ film is provided on the entire surface over the gate insulating film 42, the active layer 43, and the stopper insulating film 44. A contact hole formed in a position corresponding to the drain 43d is filled with a metal such as Al to form a connection with a power source line 46. Further, a planarizing insulating film 3 made of an organic resin or a similar material is formed over the entire surface for planarization. Subsequently, a contact hole is formed in the planarizing insulating film 3 in a position corresponding to the source 43s. A transparent electrode 4 composed of ITO (indium tin oxide) or a similar material is formed through this contact hole to contact the source 43s.

The emissive layer 5 is an emissive element layer comprising a first hole-transport layer 5a composed of MTDATA (4,4',4"-tris(3-methylphenylphenylamino)triphenylamine), a second hole-transport layer 5b composed of TPD (N,N'-diphenyl-N,N'-di(3-methylphenyl)-1,1'-biphenyl-4,4'-diamine), an emissive layer 5c formed of $Bebq_2$ (bis(10-hydroxybenzo[h]quinolinato)beryllium) including quinacridone derivatives, and an electron transport layer 5d made of $Bebq_2$. The above-described structure is disclosed in, for example, Japanese Patent Applications No. Hei 11-22183 and No. Hei 11-22184.

A TFT having a bottom gate type structure wherein the gate electrode is located closer to the substrate compared to the active layer is described herein as an example. However, the TFT may have any type of structure as long as the TFT can apply a voltage selectively to each one of the plurality of pixel electrodes. For example, the TFT may have a top gate type structure wherein the active layer is disposed closer to the substrate compared to the gate electrode.

Although an organic EL display device having a display region configured by sandwiching an emissive layer with electrodes is used as an example in the above-described embodiment, the present invention is not limited to such a device. The present invention can similarly be implemented in various display and emissive devices such as vacuum fluorescent display (VFD) devices and LED devices. However, an organic EL display device is especially vulnerable to moisture such that any slight separation between the substrates cannot be overlooked. Accordingly, prevention of separation between substrates by using the present invention is most beneficial when applied in an organic EL display device.

What is claimed is:

1. An active matrix type display device having a display region arranged between first and second substrates composed of different materials, comprising:

a seal for adhering said first and second substrates to one another; wherein said display region comprises selective drive circuits each provided for each pixel, an insulating film formed covering said selective drive circuits, and pixel electrodes each corresponding to each pixel and disposed on said insulating film; and said insulating film is arranged between said seal and said first and/or second substrates as a buffer layer.

2. The display device as defined in claim 1, wherein said insulating film extends from said display region to an area between said seal and said first and/or second substrate to serve as said buffer layer.

3. The display device as defined in claim 1, wherein said insulating film is a planarizing insulating film.

4. The display device as defined in claim 1, wherein said insulating film is a planarizing insulating film, and said planarizing insulating film extends to an area between said first substrate and said seal.

5. The display device as defined in claim 1, wherein said display region comprises an organic electroluminescence element in which an organic layer containing an organic emissive material is formed between electrodes.

6. The display device as defined in claim 1, wherein a desiccant is mixed in said seal.

7. An active matrix type display device having a display region arranged between first and second substrates composed of different materials, comprising:
    a seal for adhering said first and second substrates to one another; wherein
        said display region comprises selective drive circuits each provided for each pixel, an insulating film formed covering said selective drive circuits, and pixel electrodes each corresponding to each pixel and disposed on said insulating film; and
        said insulating film is arranged between said seal and said first and/or second substrates as a buffer layer, wherein
            said first substrate is a transparent insulating substrate; and
            said second substrate is a protective casing formed covering said display region.

8. The display device as defined in claim 7, wherein said first substrate is made of glass or resin; and said second substrate is made of metal.

9. An active matrix type display device having a display region arranged between first and second substrates composed of different materials, comprising:
    a seal for adhering said first and second substrates to one another; wherein
        said display region comprises selective drive circuits each provided for each pixel, an insulating film formed covering said selective drive circuits, and pixel electrodes each corresponding to each pixel and disposed on said insulating film; and
        said insulating film is arranged between said seal and said first and/or second substrates as a buffer layer, wherein
            said insulating film is a planarizing insulating film,
            said planarizing insulating film extends to an area between said first substrate and said seal, and
            said planarizing insulating film is composed of a material softer compared to said seal and said first substrate.

10. An active matrix type display device having a display region arranged between first and second substrates composed of different materials, comprising:
    a seal for adhering said first and second substrates to one another; wherein
        said display region comprises selective drive circuits each provided for each pixel, an insulating film formed covering said selective drive circuits, and pixel electrodes each corresponding to each pixel and disposed on said insulating film;
        said insulating film is arranged between said seal and said first and/or second substrates as a buffer layer;
        a terminal connected to said display region via a wiring and exposed outside said display device; and
        said buffer layer is arranged between said wiring or said terminal and said seal.

11. A light-emitting device in which an emissive region having an emissive element is sealed between first and second substrates having different coefficients of thermal expansion, wherein
    said first and second substrates are adhered to one another by a seal in an area surrounding said emissive region;
    said emissive region comprises selective drive circuits each provided for each pixel, an insulating film formed covering said selective drive circuits, and pixel electrodes each corresponding to each pixel, disposed on said insulating film, and forming a portion of said emissive element; and
    said insulating film is arranged between said seal and said first and/or second substrate as a buffer layer.

12. The light-emitting device as defined in claim 11, wherein a desiccant is mixed in said seal.

13. The light-emitting device as defined in claim 11, wherein said emissive element is an organic electroluminescence element containing an organic emissive material.

14. The display device as defined in claim 11, wherein said emissive region includes an insulating film; and said insulating film extends to an area between said seal and said first and/or second substrate to serve as said buffer layer.

15. The display device as defined in claim 11, wherein said emissive region comprises selective drive circuits provided for each pixel, a planarizing insulating film formed covering said selective drive circuits, and pixel electrodes disposed on said planarizing insulating film corresponding to each of said selective drive circuits; and
    said planarizing insulating film serves as said buffer layer.

16. An active matrix type display device in which a display region having a display element is disposed between first and second substrates, said active matrix type light-emitting device comprising:
    a seal for adhering said first and second substrates to one another, wherein
    on the side of the said first substrate, there are provided selective drive circuits each provided for each pixel, an insulting film formed covering said selective drive circuits, pixel electrodes each corresponding to each pixel, disposed on said insulating film, and forming a part of said display element, and other components of said display element layered on said pixel electrodes, and
    said insulating film is provided between said seal and said first substrate as a buffer layer.

17. The active matrix type light-emitting device as defined in claim 16, wherein
    said selective drive circuit includes a thin film transistor.

18. An active matrix type light-emitting device in which an emissive region having an electroluminescence element is sealed between first and second substrates, wherein
    said first and second substrates are adhered to one another by a seal in an area surrounding said emissive region;
    selective drive circuits each provided for each pixel and each for driving corresponding electroluminescence element, an insulting film formed covering said selective drive circuits, and said electroluminescence elements are provided on the side of said first substrate, each of said electroluminescence elements comprising a pixel electrode corresponding to each pixel and disposed on said insulating film, an element layer on said pixel electrode and including at least an emissive layer, and an electrode layer on said element layer and opposing said pixel electrode, and
    said insulating film is disposed between said seal and said first substrate as a buffer layer.

19. The active matrix type light-emitting device as defined in claim 18, wherein
    said insulating film extends from said emissive region to an area between said first substrate and said seal to serve as said buffer layer.

20. The active matrix light-emitting device as defined in claim 18, wherein
said insulating film includes a silicon oxide film.

21. The active matrix light-emitting device as defined in claim 18, wherein said insulating film includes a silicon nitride film.

22. An active matrix type light-emitting device in which an emissive region having an electroluminescence element is sealed between first and second substrates, wherein
said first and second substrates are adhered to one another by a seal in an area surrounding said emissive region;
selective drive circuits each provided for each pixel and each for driving corresponding electroluminescence element, an insulting film formed covering said selective drive circuits, and said electroluminescence elements are provided on the side of said first substrate, each of said electroluminescence elements comprising a pixel electrode corresponding to each pixel and disposed on said insulating film, an element layer on said pixel electrode and including at least an emissive layer, and an electrode layer on said element layer and opposing said pixel electrode; and
said insulating film is disposed between said seal and said first substrate as a buffer layer, wherein
said insulating film is a resin.

23. An active matrix type display device in which a display region having a display element is disposed between first and second substrates, said active matrix type light-emitting device comprising:
a seal for adhering said first and second substrates to one another, wherein
on the side of the said first substrate, there are provided selective drive circuits each provided for each pixel, an insulting film formed covering said selective drive circuits, pixel electrodes each corresponding to each pixel, disposed on said insulating film, and forming a part of said display element, and other components of said display element layered on said pixel electrodes,
said insulating film is provided between seal and said first substrate as a buffer layer, and
said insulating film is a resin.

24. A light-emitting device in which an emissive region having an emissive element is sealed between first and second substrates having different coefficients of thermal expansion, wherein
said first and second substrates are adhered to one another by a seal in an area surrounding said emissive region;
said emissive region comprises selective drive circuits each provided for each pixel, an insulating film formed covering said selective drive circuits, and pixel electrodes each corresponding to each pixel, disposed on said insulating film, and forming a portion of said emissive element;
said insulating film is arranged between said seal and said first and/or second substrate as a buffer layer;
said first substrate is a transparent insulating substrate; and
said second substrate is a protective casing formed covering said display region.

25. The display device as defined in claim 24, wherein
said first substrate is made of glass or resin; and
said second substrate is made of metal.

26. The display device as defined in claim 24, wherein
said insulating film is composed of a material softer compared to said seal and said first substrate.

27. The display device as defined in claim 24, further comprising:
a terminal connected to said display region via a wiring and exposed outside said display device; wherein
said buffer layer is arranged between said wiring or said terminal and said seal.

28. The display device as defined in claim 24, wherein
said insulating film is a resin.

29. An active matrix type display device in which a display region having a display element is disposed between first and second substrates, said active matrix type light-emitting device comprising:
a seal for adhering said first and second substrates to one another, wherein
on the side of the said first substrate, there are provided selective drive circuits each provided for each pixel, an insulting film formed covering said selective drive circuits, pixel electrodes each corresponding to each pixel, disposed on said insulating film, and forming a part of said display element, and other components of said display element layered on said pixel electrodes,
said insulating film is provided between said seal and said first substrate as a buffer layer,
said first substrate is a transparent insulating substrate; and
said second substrate is a protective casing forming covering said display region.

30. The display device as defined in claim 29, wherein
said first substrate is made of glass or resin; and
said second substrate is made of metal.

31. The display device as defined in claim 29, wherein
said insulating film is composed of a material softer compared to said seal and said first substrate.

32. The display device as defined in claim 29, further comprising:
a terminal connected to said display region via a wiring and exposed outside said display device; wherein
said buffer layer is arranged between said wiring or said terminal and said seal.

33. The display device as defined in claim 29, wherein
said insulating film is a resin.

34. An active matrix type light-emitting device in which an emissive region having an electroluminescence element is sealed between first and second substrates, wherein
said first and second substrates are adhered to one another by a seal in an area surrounding said emissive region;
selective drive circuits each provided for each pixel and each for driving corresponding electroluminescence element, an insulting film formed covering said selective drive circuits, and said electroluminescence elements are provided on the side of said first substrate, each of said electroluminescence elements comprising a pixel electrode corresponding to each pixel and disposed on said insulating film, an element layer on said pixel electrode and including at least an emissive layer, and an electrode layer on said element layer and opposing said pixel electrode;
said insulating film is disposed between said seal and said first substrate as a buffer layer;
said first substrate is a transparent insulating substrate; and
said second substrate is a protective casing formed covering said display region.

35. The display device as defined in claim 34, wherein said first substrate is made of glass or resin; and
said second substrate is made of metal.

36. The display device as defined in claim 34, wherein said insulating film is composed of a material softer compared to said seal and said first substrate.

37. The display device as defined in claim 34, further comprising:
a terminal connected to said display region via a wiring and exposed outside said display device; wherein
said buffer layer is arranged between said wiring or said terminal and said seal.

38. The display device as defined in claim 34, wherein said insulating film is a resin.

39. An active matrix type display device having a display region arranged between first and second substrates composed of different materials, comprising:
a seal for adhering said first and second substrates to one another, wherein
said display region comprises selective drive circuits each provided for each pixel, an insulating film formed covering said selective drive circuits, and pixel electrodes each corresponding to each pixel and disposed on said insulating film;
said insulating film is arranged between said seal and said first and/or second substrates as a buffer layer; and
said insulating film is composed of a material softer compared to said seal and said first substrate.

40. The display device as defined in claim 39, wherein said first substrate is made of glass or resin; and
said second substrate is made of metal.

41. The display device as defined in claim 39, further comprising:
a terminal connected to said display region via a wiring and exposed outside said display device; wherein
said buffer layer is arranged between said wiring or said terminal and said seal.

42. The display device as defined in claim 39, wherein said insulating film is a resin.

43. A light-emitting device in which an emissive region having an emissive element is scaled between first and second substrates having different coefficients of thermal expansion, wherein
said first and second substrates are adhered to one another by a seal in an area surrounding said emissive region;
said emissive region comprises selective drive circuits each provided for each pixel, an insulating film formed covering said selective drive circuits, and pixel electrodes each corresponding to each pixel, disposed on said insulating film, and forming a portion of said emissive element;
said insulating film is arranged between said seal and said first and/or second substrate as a buffer layer; and
said insulating film is composed of a material softer compared to said seal and said first substrate.

44. The display device as defined in claim 43, wherein said first substrate is made of glass or resin; and
said second substrate is made of metal.

45. The display device as defined in claim 43, further comprising:
a terminal connected to said display region via a wiring and exposed outside said display device; wherein
said buffer layer is arranged between said wiring or said terminal and said seal.

46. The display device as defined in claim 43, wherein said insulating film is a resin.

47. An active matrix type display device in which a display region having a display element is disposed between first and second substrates, said active matrix type light-emitting device comprising:
a seal for adhering said first and second substrates to one another, wherein
on the side of the said first substrate, there are provided selective drive circuits each provided for each pixel, an insulting film formed covering said selective drive circuits, pixel electrodes each corresponding to each pixel, disposed on said insulating film, and forming a part of said display element, and other components of said display element layered on said pixel electrodes,
said insulating film is provided between said seal and said first substrate as a buffer layer, and
said insulating film is composed of a material softer compared to said seal and said first substrate.

48. The display device as defined in claim 47, wherein said first substrate is made of glass or resin; and
said second substrate is made of metal.

49. The display device as defined in claim 47, further comprising:
a terminal connected to said display region via a wiring and exposed outside said display device; wherein
said buffer layer is arranged between said wiring or said terminal and said seal.

50. The display device as defined in claim 47, wherein said insulating film is a resin.

51. An active matrix type light-emitting device in which an emissive region having an electroluminescence element is sealed between first and second substrates, wherein
said first and second substrates are adhered to one another by a seal in an area surrounding said emissive region;
selective drive circuits each provided for each pixel and each for driving corresponding electroluminescence element, an insulting film formed covering said selective drive circuits, and said electroluminescence elements are provided on the side of said first substrate,
each of said electroluminescence elements comprising a pixel electrode corresponding to each pixel and disposed on said insulating film, an element layer on said pixel electrode and including at least an emissive layer, and an electrode layer on said element layer and opposing said pixel electrode;
said insulating film is disposed between said seal and said first substrate as a buffer layer; and
said insulating film is composed of a material softer compared to said seal and said first substrate.

52. The display device as defined in claim 51, wherein said first substrate is made of glass or resin; and
said second substrate is made of metal.

53. The display device as defined in claim 51, further comprising:
a terminal connected to said display region via a wiring and exposed outside said display device; wherein
said buffer layer is arranged between said wiring or said terminal and said seal.

54. The display device as defined in claim 51, wherein said insulating film is a resin.

55. A light-emitting device in which an emissive region having an emissive element is sealed between first and second substrates having different coefficients of thermal expansion, wherein said first and second substrates are adhered to one another by a seal in an area surrounding said emissive region;

said emissive region comprises selective drive circuits each provided for each pixel, an insulating film formed covering said selective drive circuits, and pixel electrodes each corresponding to each pixel, disposed on said insulating film, and forming a portion of said emissive element;

said insulating film is arranged between said seal and said first and/or second substrate as a buffer layer; and a terminal connected to said display region via a wiring and exposed outside said display device, wherein
said buffer layer is arranged between said wiring or said terminal and said seal.

56. The display device as defined in claim 55, wherein said first substrate is made of glass or resin; and
said second substrate is made of metal.

57. The display device as defined in claim 55, wherein said insulating film is a resin.

58. An active matrix type display device in which a display region having a display element is disposed between first and second substrates, said active matrix type light-emitting device comprising:

a seal for adhering said first and second substrates to one another, wherein
on the side of the said first substrate, there are provided selective drive circuits each provided for each pixel, an insulting film formed covering said selective drive circuits, pixel electrodes each corresponding to each pixel, disposed on said insulating film, and forming a part of said display element, and other components of said display element layered on said pixel electrodes;
said insulating film is provided between said seal and said first substrate as a buffer layer; and
a terminal connected to said display region via a wiring and exposed outside said display device, wherein
said buffer layer is arranged between said wiring or said terminal and said seal.

59. The display device as defined in claim 58, wherein said first substrate is made of glass or resin; and
said second substrate is made of metal.

60. The display device as defined in claim 58, wherein said insulating film is a resin.

61. An active matrix type light-emitting device in which an emissive region having an electroluminescence element is sealed between first and second substrates, wherein
said first and second substrates are adhered to one another by a seal in an area surrounding said emissive region;
selective drive circuits each provided for each pixel and each for driving corresponding electroluminescence element, an insulting film formed covering said selective drive circuits, and said electroluminescence elements are provided on the side of said first substrate, each of said electroluminescence elements comprising a pixel electrode corresponding to each pixel and disposed on said insulating film, an element layer on said pixel electrode and including at least on emissive layer, and an electrode layer on said element layer and opposing said pixel electrode;
said insulating film is disposed between said seal and said first substrate as a buffer layer; and
a terminal connected to said display region via a wiring and exposed outside said display device, wherein
said buffer layer is arranged between said wiring or said terminal and said seal.

62. The display device as defined in claim 61, wherein said first substrate is made of glass or resin; and
said second substrate is made of metal.

63. The display device as defined in claim 61, wherein said insulating film is a resin.

64. An active matrix type display device having a display region arranged between first and second substrates composed of different materials, comprising:

a seal for adhering said first and second substrates to one another, wherein
said display region comprises selective drive circuits each provided for each pixel, an insulating film formed covering said selective drive circuits, and pixel electrodes each corresponding to each pixel and disposed on said insulating film;
said insulating film is arranged between said seal and said first and/or second substrates as a buffer layer; and
said insulating film is a resin.

65. A light-emitting device in which an emissive region having an emissive element is sealed between first and second substrates having different coefficients of thermal expansion, wherein
said first and second substrates are adhered to one another by a seal in an area surrounding said emissive region;
said emissive region comprises selective drive circuits each provided for each pixel, an insulating film formed covering said selective drive circuits, and pixel electrodes each corresponding to each pixel, disposed on said insulating film, and forming a portion of said emissive element;
said insulating film is arranged between said seal and said first and/or second substrate as a buffer layer; and
said insulating film is a resin.

* * * * *